(12) United States Patent
Huang et al.

(10) Patent No.: US 11,121,197 B2
(45) Date of Patent: Sep. 14, 2021

(54) OLED PANEL AND DISPLAY DEVICE THEREOF

(71) Applicant: Wuhan China Star Optoelectronics Semiconductor Display Technology Co., Ltd., Wuhan (CN)

(72) Inventors: Jing Huang, Wuhan (CN); Hsianglun Hsu, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 141 days.

(21) Appl. No.: 16/347,814

(22) PCT Filed: Sep. 3, 2018

(86) PCT No.: PCT/CN2018/103727
§ 371 (c)(1),
(2) Date: May 7, 2019

(87) PCT Pub. No.: WO2020/024351
PCT Pub. Date: Feb. 6, 2020

(65) Prior Publication Data
US 2020/0161393 A1 May 21, 2020

(30) Foreign Application Priority Data
Jul. 30, 2018 (CN) .......................... 201810851789.X

(51) Int. Cl.
*H01L 27/32* (2006.01)
*H01L 51/52* (2006.01)

(52) U.S. Cl.
CPC ...... *H01L 27/3246* (2013.01); *H01L 51/5253* (2013.01)

(58) Field of Classification Search
CPC ............. H01L 27/3246; H01L 27/3258; H01L 27/3276; H01L 27/3248; H01L 27/3279;
(Continued)

(56) References Cited

U.S. PATENT DOCUMENTS 9,698,204 B2 * 7/2017 Kamura ................. H01L 31/055
10,170,526 B1 * 1/2019 Yang .................... H01L 27/3246
(Continued)

FOREIGN PATENT DOCUMENTS

| CN | 104821376 | 8/2015 |
|---|---|---|
| CN | 206250196 | 6/2017 |

(Continued)

*Primary Examiner* — Robert G Bachner

(57) ABSTRACT

An organic light-emitting diode (OLED) panel is provided. The OLED panel includes: a substrate having a light emitting region and a non-light emitting region; and an organic flat layer, an anode, a first pixel definition layer, a light emitting layer, a cathode and an encapsulation layer stacked on the substrate. On the non-light emitting region, a second pixel definition layer is further disposed between the first pixel definition layer and the encapsulation layer, and is disposed adjacent to a cutting location of the OLED panel-light emitting layer; and the second pixel definition layer is constructed as inverted trapezoidal structures spaced apart from each other.

20 Claims, 2 Drawing Sheets

(58) Field of Classification Search
CPC ............. H01L 27/3283; H01L 27/3295; H01L 51/5253; H01L 51/5315; H01L 51/5271
See application file for complete search history.

(56) References Cited

U.S. PATENT DOCUMENTS

| | | | |
|---|---|---|---|
| 2016/0152875 A1* | 6/2016 | No | H01L 51/5246 |
| | | | 359/893 |
| 2017/0194399 A1* | 7/2017 | Cho | H01L 27/3248 |
| 2017/0294502 A1* | 10/2017 | Ka | H01L 27/3276 |
| 2018/0190938 A1 | 7/2018 | Wang et al. | |
| 2018/0294322 A1* | 10/2018 | Han | H01L 27/3246 |
| 2019/0058020 A1* | 2/2019 | Tsai | H01L 27/3246 |

FOREIGN PATENT DOCUMENTS

| | | |
|---|---|---|
| CN | 107180923 | 9/2017 |
| CN | 107369702 | 11/2017 |

* cited by examiner

OLED PANEL AND DISPLAY DEVICE THEREOF

RELATED APPLICATIONS

This application is a National Phase of PCT Patent Application No. PCT/CN2018/103727 having International filing date of Sep. 3, 2018, which claims the benefit of priority of Chinese Patent Application No. 201810851789.X filed on Jul. 30, 2018. The contents of the above applications are all incorporated by reference as if fully set forth herein in their entirety.

FIELD AND BACKGROUND OF THE INVENTION

The present invention relates to the field of display technologies, and in particular to organic light emitting diode panels and display devices.

Organic light emitting diodes (OLEDs) have many advantages such as faster response times, wide operating temperature range, self-luminescence and flexible display. It is known as a third-generation display technology after cathode-ray tube (CRT) and liquid crystal display (LCD)/light emitting device (LED). With the increasing market demand, the development and production of flexible OLEDs have become popular fields in the display industry.

However, because organic materials are particularly sensitive to water and oxygen in the environment, flexible encapsulation technology directly relates to display life of OLED and also one of the bottlenecks restricting the development of OLEDs. For irregular shaped OLED panels, the existing flexible encapsulation technology requires frequent change of metal masks, resulting in reduced production efficiency. Moreover, water and oxygen in the environment easily enter into the OLED panel from a cutting location after the OLED panel is cut, resulting in reduced water and oxygen resistance of the OLED panel, and resulting in reduced reliability of the OLED panel encapsulation and service life of the OLED device.

TECHNICAL PROBLEM: The existing flexible encapsulation technology need to change metal masks frequently, results that the production efficiency is reduced. Moreover, water and oxygen in the environment easily invade into the OLED panel from the cutting location after the OLED panel is singulated, resulting in reduced water and oxygen resistance of the OLED panel, resulting in reduced reliability of the OLED panel encapsulation and service life of the OLED device.

SUMMARY OF THE INVENTION

The technical solutions provided by the present invention are as follows:

The present invention provides an organic light-emitting diode (OLED) panel, including:

a substrate having a light emitting region and a non-light emitting region; and an organic flat layer, an anode, a first pixel definition layer, a light emitting layer, a cathode, and an encapsulation layer stacked on the substrate, wherein, on the non-light emitting region, a second pixel definition layer is further disposed between the first pixel definition layer and the encapsulation layer, and is disposed adjacent to a cutting location of the OLED panel; and the second pixel definition layer is constructed as a plurality of inverted trapezoidal structures spaced apart from each other;

wherein the first pixel definition layer has patterned patterns spaced apart from each other, and the inverted trapezoidal structures correspond to the patterned patterns one to one; and wherein material of the second pixel definition layer is selected from a group consisting of epoxy resin, polyimide, and polymethyl methacrylate.

A preferred embodiment according to the present invention, each of the inverted trapezoidal structures has a first side and a second side opposite to each other, wherein a first lateral wall and a second lateral wall are disposed between the first side and the second side, the first side is parallel to the second side, the first side is adjacent to the first pixel definition layer, a length of the second side is greater than a length of the first side, and an included angle between the first side and the first or second lateral wall is an obtuse angle.

A preferred embodiment according to the present invention, the included angle ranges from 90 to 135 degrees.

A preferred embodiment according to the present invention, a distance between the first side and the second side ranges from 0.5 to 2 microns.

A preferred embodiment according to the present invention, the OLED panel further includes a sealant disposed on both lateral sides of the OLED panel.

A preferred embodiment according to the present invention, the encapsulation layer includes a first inorganic layer and a second inorganic layer disposed on the non-light emitting region; and the encapsulation layer includes the first inorganic layer, an organic layer, and the second inorganic layer on the light emitting region.

A preferred embodiment according to the present invention, the organic layer has a thickness ranged from 2 to 16 microns.

The present invention provides an organic light-emitting diode (OLED) panel, including:

a substrate having a light emitting region and a non-light emitting region; and an organic flat layer, an anode, a first pixel definition layer, a light emitting layer, a cathode, and an encapsulation layer stacked on the substrate, wherein, on the non-light emitting region, a second pixel definition layer is further disposed between the first pixel definition layer and the encapsulation layer, and is disposed adjacent to a cutting location of the OLED panel; and the second pixel definition layer is constructed as a plurality of inverted trapezoidal structures spaced apart from each other.

A preferred embodiment according to the present invention, the first pixel definition layer has patterned patterns spaced apart from each other, and the inverted trapezoidal structures correspond to the patterned patterns one to one.

A preferred embodiment according to the present invention, each of the inverted trapezoidal structures has a first side and a second side opposite to each other, wherein a first lateral wall and a second lateral wall are disposed between the first side and the second side, the first side is parallel to the second side, the first side is adjacent to the first pixel definition layer, a length of the second side is greater than a length of the first side, and an included angle between the first side and the first or second lateral wall is an obtuse angle.

A preferred embodiment according to the present invention, the included angle ranges from 90 to 135 degrees.

A preferred embodiment according to the present invention, a distance between the first side and the second side ranges from 0.5 to 2 microns.

A preferred embodiment according to the present invention, the OLED panel further includes a sealant disposed on both lateral sides of the OLED panel.

A preferred embodiment according to the present invention, the encapsulation layer includes a first inorganic layer and a second inorganic layer disposed on the non-light emitting region; and the encapsulation layer includes the first inorganic layer, an organic layer, and the second inorganic layer on the light emitting region.

A preferred embodiment according to the present invention, the organic layer has a thickness ranged from 2 to 16 microns.

A preferred embodiment according to the present invention, material of the second pixel definition layer is selected from a group consisting of epoxy resin, polyimide, and polymethyl methacrylate.

Accordingly, the present invention also provides an organic light-emitting diode (OLED) display device, including an OLED panel which includes:

a substrate having a light emitting region and a non-light emitting region; and an organic flat layer, an anode, a first pixel definition layer, a light emitting layer, a cathode, and an encapsulation layer stacked on the substrate, wherein, on the non-light emitting region, a second pixel definition layer is further disposed between the first pixel definition layer and the encapsulation layer, and is disposed adjacent to a cutting location of the OLED panel; and the second pixel definition layer is constructed as a plurality of inverted trapezoidal structures spaced apart from each other.

A preferred embodiment according to the present invention, the first pixel definition layer has patterned patterns spaced apart from each other, and the inverted trapezoidal structures correspond to the patterned patterns one to one.

A preferred embodiment according to the present invention, each of the inverted trapezoidal structures has a first side and a second side opposite to each other, wherein a first lateral wall and a second lateral wall are disposed between the first side and the second side, the first side is parallel to the second side, the first side is adjacent to the first pixel definition layer, a length of the second side is greater than a length of the first side, and an included angle between the first side and the first or second lateral wall is an obtuse angle.

A preferred embodiment according to the present invention, the included angle ranges from 90 to 135 degrees.

BENEFICIAL EFFECT: By constructing a second pixel definition layer as a plurality of inverted trapezoidal structures spaced apart from each other on a non-light emitting regions, it does not require to change metal masks during encapsulation, resulting in improving production efficiency. Moreover, it effectively prevents external water and oxygen to invade into the OLED panel from the cutting location after the OLED panel is singulated, so that improves water and oxygen resistance of the OLED panel, such that improves reliability of the OLED panel encapsulation and prolongs service life of the OLED device.

BRIEF DESCRIPTION OF THE SEVERAL VIEWS OF THE DRAWINGS

To more clearly illustrate the technical solutions in the embodiments of the present invention, the drawings used in the description of the embodiments will be briefly described below. It is apparent that the drawings accompanying with the following description are only some embodiments of the present invention. Other drawings can also be obtained from those skilled in the art based on these drawings without paying any creative effort.

DESCRIPTION OF SPECIFIC EMBODIMENTS OF THE INVENTION

Figure 1:
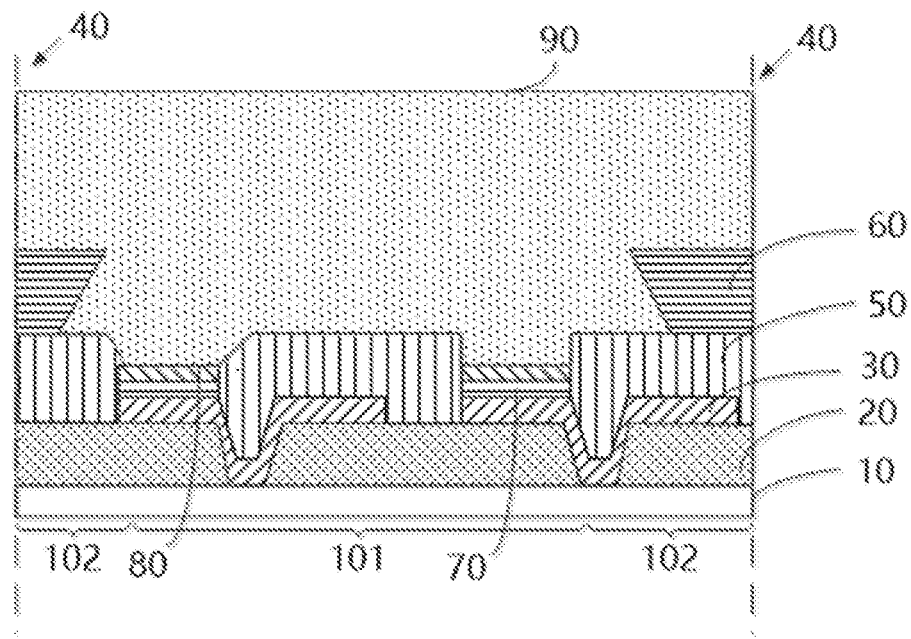
FIG. 1 is a schematic cross-sectional view of an OLED panel according to an embodiment of the present invention.

The embodiments of the present invention are described in detail below, and the examples of the implementation are illustrated in the drawings, and the same or similar reference numerals indicate the same or similar elements or elements having the same or similar functions. The embodiments described below with reference to the drawings are intended to be illustrative of the present invention and cannot be understood as limitations of the present invention.

In the description of the present invention, it is to be understood that the terms "center", "longitudinal", "transverse", "length", "width", "thickness", "upper", "lower", "front", "back", "left", "right", "vertical", "horizontal", "top", "bottom", "inner", "outer", "clockwise", "counter-clockwise", etc., indicated orientation or positional relationship are based on the orientation or positional relationship shown in the drawings, and are merely for the convenience of describing the present invention and simplifying the description, instead of indicating or implying that the device or component referred to must have a particular orientation, constructed and operated in a particular orientation. Therefore, it cannot be constructed as a limitation of the present invention. Moreover, the terms "first" and "second" are only used for descriptive purposes and are not to be construed as indicating or implying a relative importance or implicitly indicating the number of technical features indicated. Thus, features defined "first" or "second" may include one or more features either explicitly or implicitly. In the description of the present invention, the term "a plurality of" may be two or more than two, unless otherwise specifically defined.

In the description of the present invention, it should be noted that the terms "mount", "connect to", and "connection" should be understood broadly, for example, it can be a fixed connection, a removeable connection, or connected in one piece; it can be a mechanical connection, it can also be electrically connected or can be communicated with each other; it can be directly connected, it can also be indirectly connected through an intermediary medium. It can be the internal communication of two elements or the interaction of two elements. For those of ordinary skill in the art, the specific meaning of the above terms of the present invention can be understood on a case-by-case basis.

In the present invention, unless otherwise expressly stated and defined, a first feature "above" or "under" a second feature may include that the first feature directly contacts with the second feature, and may also include that the first feature does not directly contact with the second feature. Moreover, the first feature "on", "above" and "over" the second feature includes the first feature right above and oblique upper the second feature, or merely indicating that a level of the first feature is higher than a level of the second feature. The first feature "below", "under" and "beneath" the second feature includes the first feature right below and oblique below the second feature, or merely indicating that a level of first feature is less than a level of the second feature.

The following disclosure provides many different embodiments or examples for implementing different structures of the present invention. In order to simplify the disclosure of the present invention, the components and arrangements of the specific examples are described below. Certainly, they are merely examples and are not intended to limit the invention. In addition, the present invention may be repeated with reference numerals and/or reference letters in the different examples, which are for the purpose of simplicity and clarity, and do not indicate the relationship between the various embodiments and/or arrangements discussed. Moreover, the present invention provides examples of various specific processes and materials, but one of ordinary skill in the art will recognize that other processes and/or the use of other materials can be used.

Please refer to FIG. 1. FIG. 1 is a schematic cross-sectional view of an organic light-emitting diode (OLED) panel according to an embodiment of the present invention.

An embodiment of the present invention provides an organic light-emitting diode (OLED) panel, including:

a substrate 10 having a light emitting region 101 and a non-light emitting region 102; and an organic flat layer 20, an anode 30, a first pixel definition layer 50, a light emitting layer 70, a cathode 80, and an encapsulation layer 90 stacked on the substrate 10.

On the non-light emitting region 102, a second pixel definition layer 60 is further disposed between the first pixel definition layer 50 and the encapsulation layer 90, and is disposed adjacent to a cutting location 40 of the OLED panel; and the second pixel definition layer 60 is constructed as a plurality of inverted trapezoidal structures spaced apart from each other, so that external water and oxygen is prevent from entering the cutting location 40 after completion of cutting of the OLED panel.

Specifically, the substrate 10 may be an array substrate formed with thin-film transistors, and the array substrate 10 includes the light emitting region 101 and the non-light emitting region 102, and the organic flat layer 20, the anode 30, the first pixel definition layer 50, the light emitting layer 70, the cathode 80, and the encapsulation layer 90 stacked on the array substrate 10. The light emitting layer 70 may include a hole injection layer, a hole transport layer, an organic light emitting layer, an electron transport layer, and an electron injection layer (not shown in the drawings) which are disposed in a stacked manner, and the cathode 80 is disposed on the electron injection layer. Moreover, an optical path adjustment layer (not shown) may also be disposed on the cathode 80. When the OLED array substrate 10 is operating, electrons are injected from the cathode 80 to the electron injection layer, holes are injected from the anode 30 into the hole transport layer, and electrons are transported through the electron transport layer and holes are transported through the hole transport layer, and then electrons and holes migrate to the light emitting layer and meet in the light emitting layer to form excitons and excite the luminescent molecules, which emit visible light by radiation relaxation.

On the non-light emitting region 102, the second pixel definition layer 60 is further disposed between the first pixel definition layer 50 and the encapsulation layer 90, and is disposed adjacent to a cutting location 40 of the OLED panel; the second pixel definition layer 60 is constructed by a plurality of inverted trapezoidal structures spaced apart from each other. Specifically, after the process of the first pixel definition layer 50 is completed, the second pixel definition layer 60 is directly formed on the first pixel definition layer 50. Optionally, the method of forming the second pixel definition layer 60 may by chemical vapor deposition, utilize a metal mask to form the second pixel definition layer 60 having a plurality of inverted trapezoidal structures on the first pixel definition layer 50. It should be noted that, because the second pixel definition layer 60 is constructed as the inverted trapezoidal structures, when forming the encapsulation layer 90 on the irregular OLED panel, the metal mask is not required to be changed according to a shape of each region of the OLED panel, so that improves the production efficiency. Moreover, because the second pixel definition layer 60 is disposed on the first pixel definition layer 50, and the second pixel definition layer 60 is raised by the first pixel definition layer 50, it effectively prevents external water and oxygen to invade into the OLED panel from the cutting location when the OLED panel is cutting.so that improves water and oxygen resistance of the OLED panel, such that improves reliability of the encapsulation.

Furthermore, it should be noted that the organic flat layer 20, the anode, and the first pixel definition layer 50 are firstly formed on the substrate 10, and then the second pixel definition layer 60 is formed on the first pixel definition layer 50, and finally the light emitting layer 70, cathode 80 and encapsulation layer 90 are formed. Specific structures of the OLED panel please refer to the above-mentioned embodiments, and are not described detail herein again.

Preferably, the first pixel definition layer has patterned patterns spaced apart from each other, and the inverted trapezoidal structures correspond to the patterned patterns one to one.

Figure 2:
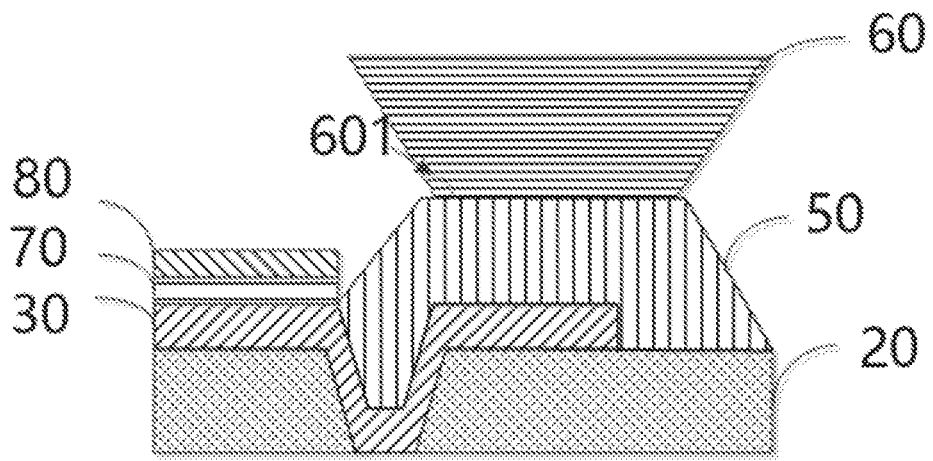
FIG. 2 is a schematic cross-sectional view of a partial region of an OLED panel according to an embodiment of the present invention.

Please refer to FIG. 2. FIG. 2 is a schematic cross-sectional view of a partial region of an organic light-emitting diode (OLED) panel according to an embodiment of the present invention.

A first pixel definition layer 50 includes patterned patterns spaced apart from each other, and a shape of the patterns is specifically determined according to actual conditions. Moreover, any of the patterned patterns has an inverted trapezoidal structure of the second pixel definition layer 60 disposed thereon.

Please refer to FIG. 1 in combination with FIG. 2, preferably, each of the inverted trapezoidal structures has a first side and a second side opposite to each other, wherein a first lateral wall and a second lateral wall are disposed between the first side and the second side, the first side is parallel to the second side, the first side is adjacent to the first pixel definition layer 50, a length of the second side is greater than a length of the first side, and an included angle 601 between the first side and the first or second lateral wall is an obtuse angle.

Preferably, the included angle 601 ranges from 90 to 135 degrees.

Preferably, a distance between the first side and the second side ranges from 0.5 to 2 microns.

It should be noted that, when the encapsulation layer 90 is formed on the irregular shape OLED panel, because a length of the second side of the inverted trapezoid is greater than a length of the first side, the encapsulation layer 90 can well cover the second pixel definition layer 60 (i.e. each of the inverted trapezoidal structures). Therefore, it does not require to frequently change the metal masks according to the actual shape of the OLED panel, so that improves the production efficiency of the OLED panel.

Figure 3:
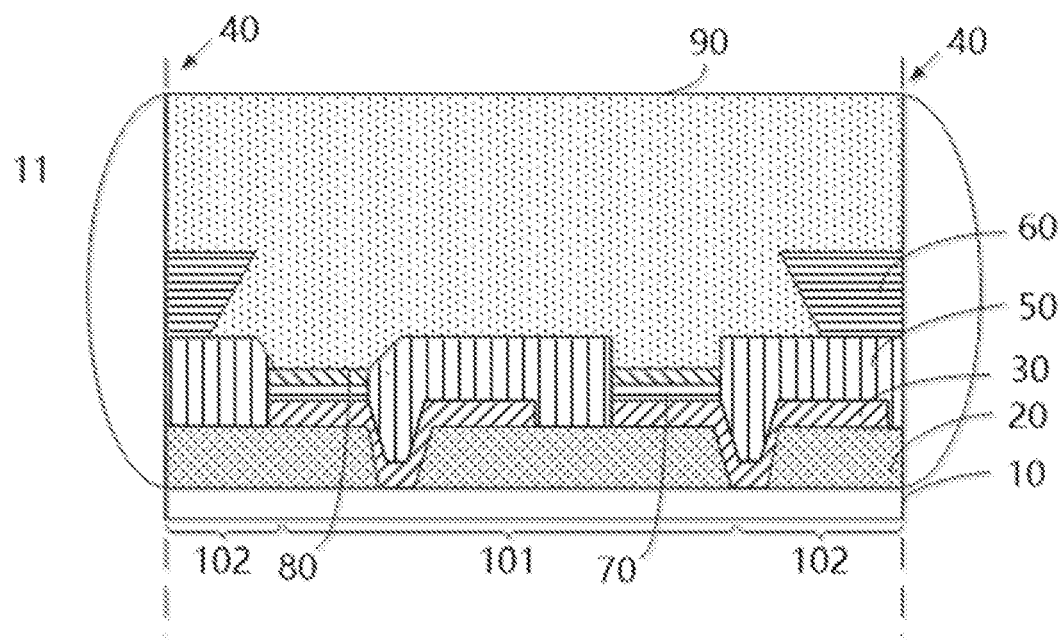
FIG. 3 is a schematic cross-sectional view of an OLED panel according to a preferred embodiment of the present invention.

Please refer to FIG. 3. FIG. 3 is a schematic cross-sectional view of an organic light-emitting diode (OLED) panel according to a preferred embodiment of the present invention.

After the singulation process of the OLED panel is completed, a sealant 11 may be attached to both lateral sides of the substrate 10.

Specifically, after the encapsulation process of the OLED panel is completed, the OLED panel can be singulated by laser cutting. First, the OLED panel after the encapsulation process completed is transferred to a workbench of a cutting apparatus, and then the OLED panel is cut according to the predetermined cutting location 40. After the singulation is completed, the sealant 11 is attached to both lateral sides of the substrate.

Figure 4:
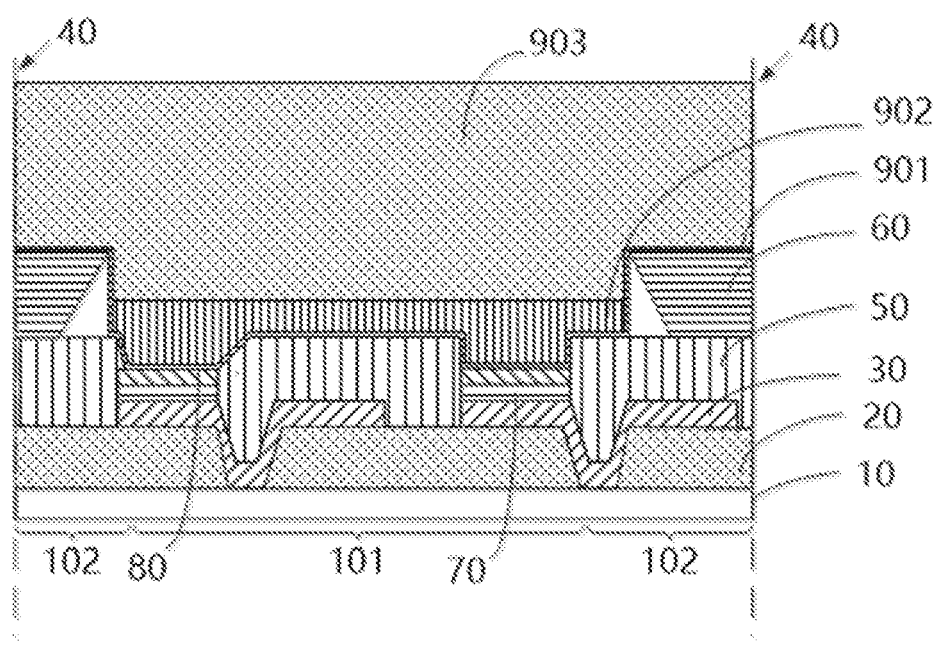
FIG. 4 is a schematic cross-sectional view of an OLED panel according to another preferred embodiment of the present invention.

Next, please refer to FIG. 4. FIG. 4 is a schematic cross-sectional view of an organic light-emitting diode (OLED) panel according to another preferred embodiment of the present invention.

The encapsulation layer 90 includes a first inorganic layer 901 and a second inorganic layer 903 disposed on the non-light emitting region 102; and the encapsulation layer includes the first inorganic layer 901, an organic layer 902, and the second inorganic layer 903 on the light emitting region 101. It should be noted that, in order to prevent external water vapor or oxygen from reacting with the organic material, cause that devices in the OLED panel are disabled, so that the first inorganic layer 901 and the second inorganic layer 903 are disposed on the non-light emitting region 102, thereby reducing invading paths of water vapor or oxygen, to achieve the purpose of improving water and oxygen barrier capacity of the OLED panel.

Preferably, the organic layer 902 has a thickness ranged from 2 to 16 microns.

Preferably, material of the second pixel definition layer 60 is selected from a group consisting of epoxy resin, polyimide, and polymethyl methacrylate.

Correspondingly, the present invention also provides an organic light-emitting diode (OLED) display panel including the OLED panel according to any of the embodiments of the present invention.

In this embodiment, by providing a second pixel definition layer on a first pixel definition layer in a non-light emitting region 102, not only improves the production efficiency, but also improves water and oxygen resistance capability of cutting location of the OLED panel, so that improves reliability of the OLED panel encapsulation and prolongs service life of the OLED device.

The OLED panel and the display device provided by the embodiments of the present invention are described in detail. The principles and implementations of the present invention are described in combination with specific embodiments. The above description of the embodiments is merely for the purpose of understanding the invention. In the meantime, for those skilled in the art, there will be changes in the specific implementation and application scope according to the idea of the present invention. In conclusion, the content of the specification of the present invention should not be construed as limitations of the scope of the present invention.

What is claimed is:

1. An organic light-emitting diode (OLED) panel, comprising:
    a substrate having a light emitting region and a non-light emitting region; and
    an organic flat layer, an anode, a first pixel definition layer, a light emitting layer, a cathode, and an encapsulation layer stacked on the substrate,
    wherein, on the non-light emitting region, a second pixel definition layer is further disposed between the first pixel definition layer and the light encapsulation layer, and is disposed adjacent to a cutting location of the OLED panel; and the second pixel definition layer is configured as a plurality of inverted trapezoidal structures spaced apart from each other;
    wherein the first pixel definition layer has patterned patterns spaced apart from each other, and the inverted trapezoidal structures correspond to the patterned patterns one to one;
    wherein material of the second pixel definition layer is selected from a group consisting of epoxy resin, polyimide, and polymethyl methacrylate; and
    wherein the first pixel definition layer, the second pixel definition layer and the encapsulation layer are sequentially stacked at a side wall of the OLED panel, and the first pixel definition layer covers a side surface of the anode and a side surface of the cathode to keep the anode and the cathode in a distance away from the side wall of the OLED panel to prevent the anode and the cathode from being exposed from the side wall of the OLED panel.

2. The OLED panel according to claim 1, wherein each of the inverted trapezoidal structures has a first side and a second side opposite to each other, wherein a first lateral wall and a second lateral wall are disposed between the first side and the second side, the first side is parallel to the second side, the first side is adjacent to the first pixel definition layer, a length of the second side is greater than a length of the first side, and an included angle between the first side and the first or second lateral wall is an obtuse angle.

3. The OLED panel according to claim 2, wherein the included angle ranges from 90 to 135 degrees.

4. The OLED panel according to claim 3, wherein a distance between the first side and the second side ranges from 0.5 to 2 microns.

5. The OLED panel according to claim 1, wherein the OLED panel further comprises a sealant disposed on both lateral sides of the OLED panel.

6. The OLED panel according to claim 1, wherein the encapsulation layer comprises a first inorganic layer and a second inorganic layer disposed on the non-light emitting region; and the encapsulation layer comprises the first inorganic layer, an organic layer, and the second inorganic layer on the light emitting region.

7. The OLED panel according to claim 6, wherein the organic layer has a thickness ranged from 2 to 16 microns.

8. An organic light-emitting diode (OLED) panel, comprising:
    a substrate having a light emitting region and a non-light emitting region; and
    an organic flat layer, an anode, a first pixel definition layer, a light emitting layer, a cathode, and an encapsulation layer stacked on the substrate,
    wherein, on the non-light emitting region, a second pixel definition layer is further disposed between the first pixel definition layer and the encapsulation layer, and is disposed adjacent to a cutting location of the OLED panel; and the second pixel definition layer is constructed as a plurality of inverted trapezoidal structures spaced apart from each other; and wherein the first pixel definition layer, the second pixel definition layer and the encapsulation layer are sequentially stacked at a side wall of the OLED panel, and the first pixel definition layer covers a side surface of the anode and a side surface of the cathode to keep the anode and the cathode in a distance away from the side wall of the OLED panel to prevent the anode and the cathode from being exposed from the side wall of the OLED panel.

9. The OLED panel according to claim 8, wherein the first pixel definition layer has patterned patterns spaced apart from each other, and the inverted trapezoidal structures correspond to the patterned patterns one to one.

10. The OLED panel according to claim 9, wherein each of the inverted trapezoidal structures has a first side and a second side opposite to each other, wherein a first lateral wall and a second lateral wall are disposed between the first side and the second side, the first side is parallel to the second side, the first side is adjacent to the first pixel definition layer, a length of the second side is greater than a length of the first side, and an included angle between the first side and the first or second lateral wall is an obtuse angle.

11. The OLED panel according to claim 10, wherein the included angle ranges from 90 to 135 degrees.

12. The OLED panel according to claim 11, wherein a distance between the first side and the second side ranges from 0.5 to 2 microns.

13. The OLED panel according to claim 8, wherein the OLED panel further comprises a sealant disposed on both lateral sides of the OLED panel.

14. The OLED panel according to claim 8, wherein the encapsulation layer comprises a first inorganic layer and a second inorganic layer disposed on the non-light emitting region; and the encapsulation layer comprises the first inorganic layer, an organic layer, and the second inorganic layer on the light emitting region.

15. The OLED panel according to claim 14, wherein the organic layer has a thickness ranged from 2 to 16 microns.

16. The OLED panel according to claim 8, wherein material of the polyimide, and polymethyl methacrylate.

17. An organic light-emitting diode (OLED) display device, comprising an OLED panel which comprises:
   a substrate having a light emitting region and a non-light emitting region; and
   an organic flat layer, an anode, a first pixel definition layer, a light emitting layer, a cathode, and an encapsulation layer stacked on the substrate,
   wherein, on the non-light emitting region, a second pixel definition layer is further disposed between the first pixel definition layer and the encapsulation layer, and is disposed adjacent to a cutting location of the OLED panel; and the second pixel definition layer is constructed as a plurality of inverted trapezoidal structures spaced apart from each other; and
   wherein the first pixel definition layer, the second pixel definition layer and the encapsulation layer are sequentially stacked at a side wall of the OLED panel, and the first pixel definition layer covers a side surface of the anode and a side surface of the cathode to keep the anode and the cathode in a distance away from the side wall of the OLED panel to prevent the anode and the cathode from being exposed from the side wall of the OLED panel.

18. The OLED display device according to claim 17, wherein the first pixel definition layer has patterned patterns spaced apart from each other, and the inverted trapezoidal structures correspond to the patterned patterns one to one.

19. The OLED display device according to claim 18, wherein each of the inverted trapezoidal structures has a first side and a second side opposite to each other, wherein a first lateral wall and a second lateral wall are disposed between the first side and the second side, the first side is parallel to the second side, the first side is adjacent to the first pixel definition layer, a length of the second side is greater than a length of the first side, and an included angle between the first side and the first or second lateral wall is an obtuse angle.

20. The OLED display device according to claim 19, wherein the included angle ranges from 90 to 135 degrees.

* * * * *